Figure 1:
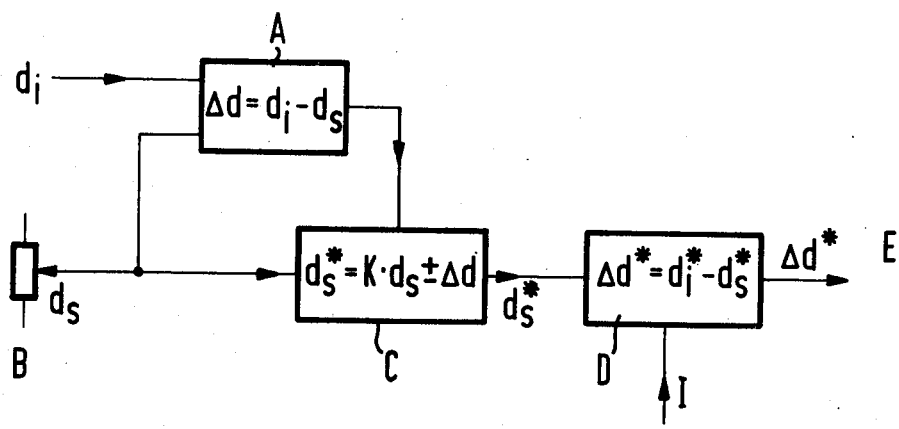

United States Patent [19]

Ticak et al.

[11] 4,162,367
[45] Jul. 24, 1979

[54] METHOD OF CRUCIBLE-FREEZE ZONE-MELTING A SEMICONDUCTOR ROD AND APPARATUS FOR CARRYING OUT THE METHOD

[75] Inventors: Friedrich Ticak, München; Hans Stut, Gröbenzell, both of Fed. Rep. of Germany

[73] Assignee: Siemens Aktiengesellschaft, Berlin and Munich, Fed. Rep. of Germany

[21] Appl. No.: 923,384

[22] Filed: Jul. 10, 1978

[30] Foreign Application Priority Data

Jul. 11, 1977 [DE] Fed. Rep. of Germany ....... 2731250

[51] Int. Cl.² .................... H05B 5/08; B01J 17/08
[52] U.S. Cl. ..................... 13/1; 13/DIG. 1; 156/601
[58] Field of Search .............. 13/1, DIG. 1, 26, 27; 219/10.43, 10.77; 23/273 SP; 156/601, 620

[56] References Cited

U.S. PATENT DOCUMENTS

| 3,243,509 | 3/1966 | Stut | 13/DIG. 1 |
| 3,814,827 | 6/1974 | Stut | 13/DIG. 1 |
| 4,080,172 | 3/1978 | Fricke et al. | 156/601 X |

FOREIGN PATENT DOCUMENTS

| 1455670 | 11/1964 | France | 156/601 |

*Primary Examiner*—R. N. Envall, Jr.
*Attorney, Agent, or Firm*—Herbert L. Lerner

[57] ABSTRACT

Method of crucible-free zone-melting a semiconductor rod which includes monitoring a melting zone formed in and traveling through a semiconductor rod surrounded by an induction heating coil, producing a respective signal corresponding to values of the actual diameters d of the semiconductor rod at a crystallization interface of the melting zone, comparing the signals corresponding to the actual diameter values d with a signal corresponding to a nominal diameter value $d_s$ so as to produce a signal corresponding to a respective first control deviation $\Delta d$, continuously combining the signals corresponding to the actual diameter values d and the signal corresponding to the respective first control deviation $\Delta d$ to form respective signals corresponding to a new nominal diameter value $d_s^*$, respectively, in accordance with the relationships:

(a) $d_s^* = k \cdot d_s \pm \Delta d$, wherein (b) $0.3 \leq k \leq 1.4$, and k = a constant, comparing the respective signals corresonding to the new nominal diameter value $d_s^*$ to respective signals corresponding to an actual diameter value $d_s^*$ of the melting zone in a given substantially horizontal cross section thereof located between a melting interface and a maximal, substantially horizontal cross section of the melting zone and having a fixed spacing from at least one of said induction heating coil and said melting interface so as to produce a signal corresponding to a respective second control deviation $\Delta d^*$, and controlling with the signal corresponding to the respective second control Deviation $\Delta d^*$ an operating parameter having an effect upon the geometry of the melting zone so as to adjust the respective actual diameter value $d_i^*$ to the nominal diameter value.

7 Claims, 2 Drawing Figures

METHOD OF CRUCIBLE-FREEZE ZONE-MELTING A SEMICONDUCTOR ROD AND APPARATUS FOR CARRYING OUT THE METHOD

The invention relates to a method of crucible-free zone-melting a semiconductor rod and apparatus for carrying out the method, wherein the melting zone produced in the semiconductor rod by means of an induction heating coil surrounding the semiconductor rod is monitored by means of a television camera or another suitable sensor and the information obtained by means of the television camera or the sensor is used to determine actual values corresponding to respective diameters d at the crystallization boundary or interface of a melting zone formed in and traveling through the semiconductor rod, and wherein, furthermore, the actual values thus obtained are compared in a comparator with a respectively nominal or setpoint diameter value provided by a nominal value transmitter, for determining a respective control deviation $\Delta d$ and the information appearing at the output of the comparator is utilized for controlling the diameter d of the melting zone at the crystallization interface thereof and, thereby, the diameter of the rod cross section crystallizing out of the melting zone.

Such a method has been described heretofore, for example, in U.S. Pat. No. 3,814,827. It includes feeding the information appearing at the output of the comparator to one input of a second comparator, a second input of which is acted upon in accordance with information furnished by the television camera regarding the volume of the melting zone. The information appearing at the output of the second comparator is then used to control the spacing between the two solid rod portions of the semiconductor rod being processed which carry the melting zone therebetween, in the sense of a negative feedback i.e. in such manner that an existing deviation between nominal value and actual value is reduced.

It is an object of the invention to provide a method for attaining the object of the just-mentioned method but which is patentably distinct therefrom and an improvement thereover.

With the foregoing and other objects in view, there is provided, in accordance with the invention, a method of crucible-free zone-melting a semiconductor rod which comprises monitoring a melting zone formed in and traveling through a semiconductor rod surrounded by an induction heating coil, producing a respective signal corresponding to values of the actual diameters d of the semi-conductor rod at a crystallization interface of the melting zone, comparing the signals corresponding to the actual diameter values d with a signal corresponding to a nominal diameter value $d_s$ so as to produce a signal corresponding to a respective first control deviation $\Delta d$, continuously combining the signals corresponding to the actual diameter values d and the signal corresponding to the respective first control deviation $\Delta d$ to form respective signals corresponding to a new nominal diameter value $d_s^*$, respectively, in accordance with the relationships:

(a) $d_s^* = k \cdot d_s \pm \Delta d$, wherein (b) $0.3 \leq k \leq 1.4$, and k = a constant, comparing the respective signals corresponding to the new nominal diameter value $d_s^*$ to respective signals corresponding to an actual diameter value $d_i^*$ of the melting zone in a given substantially horizontal cross section thereof located between a melting interface and a maximal, substantially horizontal cross section of the melting zone and having a fixed spacing from at least one of said induction heating coil and said melting interface so as to produce a signal corresponding to a respective second control deviation $\Delta d^*$, and controlling with the signal corresponding to the respective second control deviation $\Delta d^*$ an operating parameter having an effect upon the geometry of the melting zone so as to adjust the respective actual diameter value $d_i^*$ to the nominal diameter value.

For a method in accordance with the aforementioned U.S. Pat. No. 3,814,827, a signal corresponding to the volume of the melting zone is derived from pulses supplied by the opto-electronic sensing means such as a television camera, and is compared in a subordinated control stage with the control deviation of the diameter d at the crystallization boundary or interface. In the interest of greater control sensitivity, it is more desirable in many cases, as was recognized in accordance with the invention, to employ for this purpose a control variable a exhibiting a greater relative change $\Delta a/a$ and given in the case at hand by the diameter $d^*$ as defined hereinabove. This also applied to the case wherein the volume of the melting zone is determined indirectly through mutual inductance of the melting zone and the induction heating coil and is used as the controlled variable. In this regard, actually the monitoring and control of a diameter $d^*$ of the melting zone, located beyond the maximum cross section of the melting zone, as viewed from the crystallization boundary or interface i.e. beyond the bulge of the melting zone, was found to be particularly advantageous for this purpose.

In accordance with another feature of the invention, the method includes determining a ratio k of a diameter $d^*$ to the diameter d of the crystallization interface, wherein the diameter $d^*$ is that of a cross section located between the melting interface and the maximal cross section of the melting zone, the cross section having the diameter $d^*$ being spaced a distance to be held constant from the induction heating coil; and calculating, with the thus determined value of the ratio k, the nominal diameter value $d_s^*$.

The minimum value of the aforementioned quantity k is approximately 0.3 and the maximum value, approximately 1.4 k is defined as the ratio of the diameter $d^*$ in the selected cross section of the melting zone to the diameter d at the crystallization boundary or interface of the melting zone i.e. according to the equation $k = d^*/d$. The value of this ratio is determined, on the one hand, by the dimensions of the induction heating coil of the zone melting apparatus that is used and, on the other hand, by the diameter of the rod portion to be melted, the diameter d of the crystallizing rod portion and by the spacing of the cross section having the diameter $d^*$ from the induction heating coil producing the melting zone or from the spacing of the phase boundary, the induction heating coil being a critical value. For this reason, this spacing must be maintained during the performance of the method.

If, as is usual, the melting zone is passed from the bottom to the top through the silicon rod to be zone-melted, the melting boundary or interface is then the upper boundary or interface of the melting zone, and the crystallization front or interface the lower boundary or interface thereof. As is well known, the melting zone is formed with a bulge in the lower portion thereof and a slimmed-down waist in the upper portion thereof, which, however, is largely covered by the induction heating coil and therefore appears only partly in the image of the melting zone observed by the television camera or sensed by the opto-electronic sensing means. If a television camera is used as sensor, the diameter of the melting-zone image coinciding with the first or the second scanning line lying below the lower edge of the induction heating coil image or, respectively, the corresponding diameter of the actual melting zone, will preferably be defined as the diameter $d^*$ in the sense of the invention, the optical image in the television camera having to be large enough so that the scanning line corresponding to the diameter $d^*$ is not located below the maximum bulge of the melting zone. In practice it would seem that this would always be realized due to a sufficient scale of magnification of the optical image by the television camera.

Because of the equalities $k=d^*/d=d_i^*/d_i$, it follows directly that, in the steady-state condition according to (a), $d_1$ must be equal to $d_s$. On the other hand, in the steady-state condition, $d_i^*=d_s^*$, the greater control speed and control sensitivity of the approximating of $d_i^*$ to $d_s^*$ being utilized in the method according to the invention.

In accordance with a further feature of the invention, the method includes applying the signal corresponding to the respective second control deviation $\Delta d^*$ for varying the electric power supplied to the induction heating coil so as to control the diameter $d^*$ of the melting zone.

In accordance with an added feature of the invention, wherein the semiconductor rod has two solid portions carrying the melting zone therebetween, the method comprises applying the signal corresponding to the respective second control deviation $\Delta d^*$ for varying the axial spacing between the two solid portions of the semiconductor rod.

Also in accordance with the invention, there is provided an apparatus for performing the method of crucible-free zone melting of a semiconductor rod, comprising an induction heating coil surrounding a semiconductor rod to be melted and energizable by a high-frequency power source, means for displacing the induction heating coil and the semiconductor rod relative to one another so as to pass a melting zone axially through the rod, opto-electronic sensing means having a monitoring range within which the semiconductor rod is disposed, evaluating means having an input connected to the sensing means for determining values of the actual diameter d of the semiconductor rod at a crystallization interface of the melting zone as well as at least of another diameter $d^*$ of the melting zone from respective signals delivered by the sensing means, a nominal value transmitter having an output for transmitting a signal corresponding to a respective nominal diameter value $d_s$ at the crystallization interface, first comparator means having inputs connectible to respective outputs of the evaluating means and the nominal value transmitter for comparing a respective nominal diameter value $d_s$ and a respective actual diameter value d of the melting zone at the crystallization interface thereof, the first comparator means having an output for delivering a signal corresponding to a respective first control deviation $\Delta d$, a computer, the output of the first comparator means and the output of the nominal value transmitter being connectible to a computer for determining a respective new nominal diameter $d_s^*$ in accordance with the relationships:

(a) $d_s^*=k \cdot d_s \pm \Delta d$, wherein (b) $0.3 \leq k \leq 1.4$, and k=a constant, the computer having an output, second comparator means having an input connected to the output of the computer for receiving therefrom a signal corresponding to the respective new nominal diameter value $d_s^*$, the value of at least another diameter of the melting zone determined by the evaluating means being an actual diameter value $d_i^*$ of the melting zone in a given substantially horizontal cross section thereof located between a melting interface and a maximal, substantially horizontal cross section of the melting zone and having a fixed spacing from at least one of the induction heating coil and the melting interface, second comparator means having two inputs, the evaluating means having an output connected to one of the inputs of the second comparator means for delivering thereto a signal corresponding to the respective actual diameter value $d_i^*$, the output of the computer being connected to the other input of the second comparator means, the second comparator means comparing the respective actual diameter value $d_i^*$ with the respective new nominal diameter value $d_s^*$ and having an output for delivering a signal corresponding to a respective second control deviation $\Delta d^*$, adjusting means for controlling the high-frequency power supplied to the induction heating coil in a sense of reducing the second control deviation $\Delta d^*$.

In accordance with a concomitant feature of the invention, the evaluating means are capable of determining the ratio k of a diameter $d^*$ of the melting zone in the given substantially horizontal cross section thereof to the actual diameter d at the crystallization interface of the melting zone, the evaluating means having an output for delivering a signal corresponding to a respective value of the ratio k to a corresponding input of the computer for determining the respective new nominal diameter $d_s^*$.

Other features which are considered as characteristic for the invention are set forth in the appended claims.

Although the invention is illustrated and described herein as embodied in a method of crucible-free zone-melting a semiconductor rod and apparatus for carrying out the method, it is nevertheless not intended to be limited to the details shown, since various modifications and structural changes may be made therein without departing from the spirit of the invention and within the scope and range of equivalents of the claims.

Figure 2:
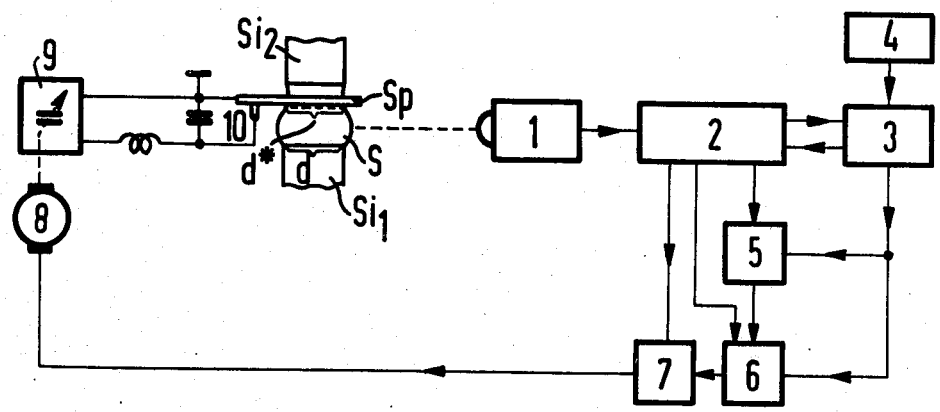

The construction and method of operation of the invention, however, together with additional objects and advantages thereof will be best understood from the following description of specific embodiments when read in connection with the accompanying drawings, in which:

FIG. 1 is a schematic view of means for forming the control deviations in both control stages according to the invention; and FIG. 2 is a schematic view of a more complete embodiment of an apparatus according to the invention and for performing the method according to the invention.

Referring now to the drawing and first, particularly, to FIG. 2 thereof, there is shown a semiconductor rod, especially a silicon rod, disposed in a conventional zone-melting apparatus and divided by an inductively-produced melting zone S into two parts, namely, a rod portion $Si_1$ crystallizing from the melting zone, and a rod portion $Si_2$ to be melted. The induction heating coil which produces the melting zone by induction is a component of a tuned circuit 10 which is coupled to the output of a high-frequency generator 9.

The melting zone S has two diameters d and d* which are important for the case at hand. d is the diameter of the melting zone at the recrystallization boundary or interface thereof which it shares in common with the crystallizing rod portion $Si_1$. Regardless of whether the melting zone S is located below or above the crystallizing rod portion $Si_1$, the melting zone S, according to past experience, is formed with a bulge and thus has a cross section thereat with a maximum diameter. Above this cross section, the diameter of the melting zone S decreases again. In the embodiment shown in FIG. 2, the crystallization boundary or interface constitutes the lower boundary of the melting zone. Consequently, the diameter d* to be used must be above the bulge. According to the invention, the selected cross section with the diameter d* should not vary the spacing thereof from the induction heating coil Sp.

An opto-electronic sensor such as a television camera 1 is connected to a conventional evaluator 2. This evaluator 2 determines the actual values for the diameter d and the diameter d* from the electrical signals furnished by the television camera 1. These actual values are designated $d_i$ and $d_i^*$, respectively. Also provided is a setpoint or nominal value transmitter 3 for a signal corresponding to the setpoint or nominal value $d_s$ and a program controller 4, which controls amongst other things, also the speed with which the silicon rod to be zone-melted is to be drawn through the area of the induction heating coil. The nominal value transmitter 3 and the program controller 4 are of conventional construction.

Signals corresponding to the actual values $d_i$ for the diameter of the melting zone at the crystallization front or interface thereof, are furnished by the evaluator 2 and, arrive at a first comparator 5 which is simultaneously given a signal corresponding to the setpoint or nominal diameter value $d_s$ from the setpoint or nominal value transmitter 3 for the diameter d of the melting zone S at the crystallization front thereof. In the comparator 5, a comparison of nominal and actual values for the diameter d occurs, as well as a determination of the control deviation $\Delta d$.

A signal corresponding to the control deviation $\Delta d$ now serves to address a computer 6, which additionally receives the evaluation of the signals of the television camera 1, a signal corresponding to the value $k=d^*/d=d_i^*/d_i$ and a signal corresponding to the setpoint or nominal value $d_s$ from the nominal value transmitter 3. The computer 6 is of such construction that it can determine from the information fed into it, the setpoint or nominal value $d_s^*=k\cdot d_s \leq \Delta d$. In this regard, either "$+\Delta d$" or "$-\Delta d$" can be taken therefrom. It is evidently proper, however, to stay with the same arithmetic sign once it is chosen. The setpoint or nominal value $d_s^*$ determined in the computer 6 is compared in a second comparator 7 with the value $d_i^*$ obtained by the evaluator 2 from the signals furnished by the television camera 1. The second control deviation $\Delta d^*$ thus obtained serves to address an operating parameter of the apparatus per se for the zone melting, that operating parameter controlling the geometry of the melting zone S. For this purpose, consideration is given to:

1. the compressing-stretching equipment i.e. the rod end holders and the means for moving them toward and away from one another, which determines the spacing of the two solid parts $Si_1$ and $Si_2$ of the semiconductor rod, and 2. the intensity of the high-frequency current fed to the induction heating coil Sp.

When applying the method according to the invention, it is advisable to use the control deviation $\Delta d^*$ for influencing, by means of a servomotor 8, the frequency of the high-frequency generator 9, supplying the tuned circuit 10 and thereby, the induction heating coil Sp with high-frequency energy, so that the control deviation $\Delta d^*$ is diminished i.e. is successively caused to vanish. On the other hand, the spacing of the two solid parts $Si_1$ and $Si_2$ of the semiconductor rod, which carry the melting zone between them, can also be used as the control or adjusting element by means of a compressing-stretching device, to perform the method according to the invention. Finally, the possibility also exists of applying the method according to the invention, additionally, to another control for the diameter d, for example, in accordance with German Pat. No. 1,153,908 or German Pat. No. 1,198,324 or U.S. Pat. No. 3,814,827, respectively.

In FIG. 1, the comparators A and D, the setpoint or nominal value transmitter B for the first control stage and the setpoint or nominal value transmitter C for the second control stage, which are of considerable importance for performing the method according to the invention, are shown together with legends indicating the functions performed by them. They can all be realized by conventional computers. In the case at hand, it is advantageous to provide the evaluator 2 with an analog-to-digital converter, which makes the values of $d_i$, $d_i^*$ and k available to digital form, so that signals corresponding thereto can be fed directly to the computers 5, 6 and 7 corresponding to A, C and D in FIG. 1, respectively.

There are claimed:

1. Method of crucible-free zone-melting a semiconductor rod which comprises monitoring a melting zone formed in and traveling through a semiconductor rod surrounded by an induction heating coil, producing a respective signal corresponding to values of the actual diameters d of the semiconductor rod at a crystallization interface of the melting zone, comparing the signals corresponding to the actual diameter values d with a signal corresponding to a nominal diameter value $d_s$ so as to produce a signal corresponding to a respective first control deviation $\Delta d$, continuously combining the signals corresponding to the actual diameter values d and the signal corresponding to the respective first control deviation $\Delta d$ to form respective signals corresponding to a new nominal diameter value $d_s^*$, respectively, in accordance with the relationships:

(a) $d_s^* = k \cdot d_s \pm \Delta d$, wherein (b) $0.3 \leq k \leq 1.4$, and k = a constant, comparing the respective signals corresponding to the new nominal diameter value $d_s^*$ to respective signals corresponding to an actual diameter value $d_1^*$ of the melting zone in a given substantially horizontal cross section thereof located between a melting interface and a maximal, substantially horizontal cross section of the melting zone and having a fixed spacing from at least one of said induction heating coil and said melting interface so as to produce a signal corresponding to a respective second control deviation $\Delta d^*$, and controlling with the signal corresponding to the respective second control deviation $\Delta d^*$ an operating parameter having an effect upon the geometry of the melting zone so as to adjust the respective actual diameter value $d_i^*$ to the nominal diameter value.

2. Method according to claim 1 which comprises determining a ratio k of a diameter $d^*$ to the diameter d of the crystallization interface, wherein the diameter $d^*$ is that of a cross section located between the melting interface and the maximal cross section of the melting zone, the cross section having the diameter $d^*$ being spaced a distance to be held constant from the induction heating coil; and calculating, with the thus determined value of the ratio k, the nominal diameter value $d_s^*$.

3. Method according to claim 2 which comprises applying the signal corresponding to the respective second control deviation $\Delta d^*$ for varying the electric power supplied to the induction heating coil so as to control the diameter $d^*$ of the melting zone.

4. Method according to claim 2 wherein the semiconductor rod has two solid portions carrying the melting zone therebetween, and which comprises applying the signal corresponding to the respective second control deviation $\Delta d^*$ for varying the axial spacing between the two solid portions of the semiconductor rod.

5. Apparatus for performing the method of crucible-free zone melting of a semiconductor rod comprising an induction heating coil surrounding a semiconductor rod to be melted and energizable by a high-frequency power source, means for displacing said induction heating coil and said semiconductor rod relative to one another so as to pass a melting zone axially through the rod, opto-electronic sensing means having a monitoring range within which the semiconductor rod is disposed, evaluating means having an input connected to said sensing means for determining values of the actual diameter d of the semiconductor rod at a crystallization interface of the melting zone as well as at least of another diameter $d^*$ of the melting zone from respective signals delivered by said sensing means, a nominal value transmitter having an output for transmitting a signal corresponding to a respective nominal diameter value $d_s$ at the crystallization interface, first comparator means having inputs connectible to respective outputs of said evaluating means and said nominal value transmitter for comparing a respective nominal diameter value $d_s$ and a respective actual diameter value d of the melting zone at the crystallization interface thereof, said first comparator means having an output for delivering a signal corresponding to a respective first control deviation $\Delta d$, a computer, said output of said first comparator means and said output of said nominal value transmitter being connectible to a computer for determining a respective new nominal diameter $D_s^*$ in accordance with the relationships:

(a) $d_s^* = k \cdot d_s \pm \Delta d$, wherein (b) $0.3 \leq k \leq 1.4$, and k= a constant, said computer having an output, second comparator means having an input connected to said output of said computer for receiving therefrom a signal corresponding to the respective new nominal diameter value $d_s^*$, said value of at least another diameter of the melting zone determined by said evaluating means being an actual diameter value $d_i^*$ of the melting zone in a given substantially horizontal cross section thereof located between a melting interface and a maximal, substantially horizontal cross section of the melting zone and having a fixed spacing from at least one of said induction heating coil and said melting interface, second comparator means having two inputs, said evaluating means having an output connected to one of the inputs of said second comparator means for delivering thereto a signal corresponding to the respective actual diameter value $d_1^*$, said output of said computer being connected to the other input of said second comparator means, said second comparator means comparing the respective actual diameter value $d_i^*$ with the respective new nominal diameter value $d_s^*$ and having an output for delivering a signal corresponding to a respective second control deviation $\Delta d^*$, adjusting means for controlling the high-frequency power supplied to said induction heating coil in a sense of reducing said second control deviation $\Delta d^*$.

6. Apparatus according to claim 5 wherein said evaluating means is capable of determining the ratio k of a diameter $d^*$ of the melting zone in said given substantially horizontal cross section thereof to said actual diameter d at the crystallization interface of the melting zone, said evaluating means having an output for delivering a signal corresponding to a respective value of the ratio k to a corresponding input of said computer for determining the respective new nominal diameter $d_s^*$.

7. Apparatus according to claim 5 wherein said opto-electronic sensing means are a television camera.

* * * * *